(12) United States Patent
van der Wagt et al.

(10) Patent No.: US 9,147,620 B2
(45) Date of Patent: Sep. 29, 2015

(54) EDGE TRIGGERED CALIBRATION

(75) Inventors: Jan Paul Anthonie van der Wagt, Carlsbad, CA (US); Ronald A. Sartschev, Andover, MA (US); Gregory A. Kannall, Mountain View, CA (US)

(73) Assignee: Teradyne, Inc., North Reading, MA (US)

( * ) Notice: Subject to any disclaimer, the term of this patent is extended or adjusted under 35 U.S.C. 154(b) by 329 days.

(21) Appl. No.: 13/450,123

(22) Filed: Apr. 18, 2012

(65) Prior Publication Data

US 2013/0260485 A1 Oct. 3, 2013

Related U.S. Application Data

(63) Continuation of application No. 13/433,154, filed on Mar. 28, 2012, now abandoned.

(51) Int. Cl.
*G06F 17/30* (2006.01)
*H01L 21/66* (2006.01)
*G01R 31/319* (2006.01)

(52) U.S. Cl.
CPC ............ *H01L 22/34* (2013.01); *G01R 31/3191* (2013.01); *G01R 31/31922* (2013.01); *H01L 2924/0002* (2013.01)

(58) Field of Classification Search
CPC ................................. G06F 17/30; G06F 17/50
USPC ......................................................... 716/136
See application file for complete search history.

(56) References Cited

U.S. PATENT DOCUMENTS

| | | |
|---|---|---|
| 5,323,065 A | 6/1994 | Ebihara et al. |
| 6,380,779 B1 | 4/2002 | Lachman et al. |
| 7,187,742 B1 * | 3/2007 | Logue et al. .................. 375/376 |
| 2005/0193356 A1 * | 9/2005 | Kuekes et al. .................. 716/12 |
| 2006/0256908 A1 * | 11/2006 | Ludwig ......................... 375/375 |
| 2007/0126410 A1 * | 6/2007 | Figoli ........................... 323/283 |
| 2008/0307277 A1 | 12/2008 | Tschanz et al. |
| 2009/0249141 A1 | 10/2009 | Yasuda |
| 2010/0299644 A1 * | 11/2010 | Kawai ............................. 716/6 |

FOREIGN PATENT DOCUMENTS

WO WO 2008118841 A1 10/2008

OTHER PUBLICATIONS

International Search Report and Written Opinion for International Application No. PCT/US2013/029121 dated Jun. 3, 2013.

\* cited by examiner

*Primary Examiner* — Mohammed Alam
(74) *Attorney, Agent, or Firm* — Wolf, Greenfield & Sacks, P.C.

(57) ABSTRACT

Circuitry for measuring a propagation delay in a circuit path. The circuitry includes a one-shot edge triggered element that can be connected in a loop with the circuit path. An edge signal propagating through the circuit path triggers the one-shot element to output a pulse. The pulse propagates around the loop, again triggering the one-shot element to produce a pulse, creating a repeating series of pulses. The period between these pulses is influenced by propagation time of an edge through the loop such that a difference in the period with the circuit path connected and not connected in the loop indicates propagation delay in the circuit path. Such circuitry can be configured to independently measure, and therefore calibrate for, propagation delays associated with rising and falling edges. Calibration to separately equalize propagation delays for rising and falling edges can increase the timing accuracy of an automatic test system.

18 Claims, 9 Drawing Sheets

SREDGE allowing overlapping and surrounding S,R

| Sn-1 | Rn-1 | Sn | Rn | SREDGE Qn | Comment |
|------|------|----|----|-----------|---------|
| 0 | 0 | 1 | 0 | 1 | set |
| 0 | 0 | 0 | 1 | 0 | reset |
| 0 | 1 | 1 | 1 | 1 | set after reset (and sets as long as not returning to 00) |
| 1 | 0 | 1 | 1 | 0 | reset after set (and resets as long as not returning to 00) |
| 1 | 1 | 1 | 0 | Qn-1 | fall out of 11 to set: hold state |
| 1 | 1 | 0 | 1 | Qn-1 | fall out of 11 to reset: hold state |
| 0 | 1 | 0 | 0 | Qn-1 | SR = 00: hold |
| 1 | 0 | 0 | 0 | | |

Y Latch Truth Table:

| Equivalent Input Assertion | Sn | Rn | Yn |
|---|---|---|---|
| Snb*Rnb | 0 | 0 | Yn-1 |
| Sn*Rnb | 1 | 0 | 1 |
| Snb*Rn | 0 | 1 | 0 |
| Sn*Rn | 1 | 1 | Yn-1 |

FIG. 7A

Q Latch Truth Table:

| Equivalent Input Assertion | Sn | Rn | Yn | Xn | Qn |
|---|---|---|---|---|---|
| Sn*(Xnb+Ynb) | 1 | x | 0 | x | 1 |
| Sn*(Xnb+Ynb) | 1 | x | x | 0 | 1 |
| Rn*(Xnb+Yn) | x | 1 | 1 | x | 0 |
| Rn*(Xnb+Yn) | x | 1 | x | 0 | 0 |
| (Snb+Rnb)*Xn+Snb*Rnb | 0 | x | x | 1 | Qn-1 |
| (Snb+Rnb)*Xn+Snb*Rnb | x | 0 | x | 1 | Qn-1 |
| (Snb+Rnb)*Xn+Snb*Rnb | 1 | 1 | x | x | Qn-1 |

FIG. 7B

EDGE TRIGGERED CALIBRATION

RELATED APPLICATIONS

This Application claims the benefit under 35 U.S.C. §120 of U.S. application Ser. No. 13/433,154, entitled "EDGE TRIGGERED CALIBRATION" filed on Mar. 28, 2012, which is herein incorporated by reference in its entirety.

BACKGROUND

Electronic components, such as semiconductor devices, are frequently tested, sometimes multiple times during their manufacture, using automatic test equipment. To perform these tests, automated test equipment may include instruments that generate or measure test signals such that a range of operating conditions can be tested on a particular device. An instrument, for example, may generate or measure a pattern of digital signals to enable testing of digital logic within a semiconductor device.

Modern semiconductor devices may have large numbers of test points, possibly hundreds or even thousands. Accordingly, the test system may have multiple channels, each designed to independently generate or measure a signal for a test point. The specific value to be generated or measured at each test point may be dictated by a test program that controls all of the channels of the test system. In addition to specifying the value of a test signal, the test program may specify a time at which the test signal is to be applied or measured. Being able to control the timing of test signals is important for thorough testing of a semiconductor device because a device that produces an expected value, but at the wrong time, can nonetheless cause a system using that semiconductor device to malfunction.

The time at which a test signal is to be applied or measured at one test point may be specified in relation to the time at which a test signal is applied or measured at another test point. Accordingly, it is frequently necessary that the test signals in multiple channels be coordinated. Test systems are designed to synchronize the generation of signals within different channels. Though, merely synchronizing the times at which signals are generated may not be adequate to ensure the test signals are coordinated at the test points of the device under test. Differences in propagation delay can change the relative timing of signals, thereby affecting the accuracy of test results. To increase testing accuracy, it is known to calibrate a test system. Calibration may entail measuring relative propagation delays through channels of the test system. The propagation delay through the channels can then be adjusted. Such calibration may be done at various times, including when a test system is manufactured or, once a test system is installed, on a periodic schedule or at times depending on an amount of use.

SUMMARY

Delays associated with either the falling or rising trigger edge of an electronic signal on an electronic signal path may be measured. In some embodiments, delay measurement circuitry may be configured to selectively measure either edge. Such circuitry may be used to separately measure the delay of a rising and falling edge, allowing calibration to adjust these edge-specific delays separately.

In some embodiments, delay measurement circuitry may include an edge-triggered element that responds to either a rising trigger edge or a falling trigger edge. The delay measurement circuitry may include switching elements such that the edge triggered element can be selectively coupled to the circuit path so as to form a loop. A period measuring element may be coupled to the loop.

In operation, an edge sent through the circuit path may trigger the edge-triggered element causing it to generate a pulse, or signal in another format, that includes another trigger edge. That edge may be sent through the circuit path, looping back to the edge-triggered element to generate yet a further edge. This operation in a loop may set up a repeating sequence of edges generated by the edge-triggered element, separated in time by an amount that depends on the propagation delay of the edge through the circuit path. By measuring the time between those edges, such as with the period measuring element, information about the propagation delay through the circuit path can be obtained.

Accordingly, in one aspect, the invention relates to apparatus for determining delay along at least one circuit path. The apparatus comprises circuitry configured to form a loop containing the at least one circuit path. The circuitry comprises an edge-triggered element and a period measuring element coupled to the loop. The edge-triggered element responds only to either a rising trigger edge or falling trigger edge, but not both, of a signal in the loop.

In another aspect, the invention relates to a method for measuring edge-specific delay along at least one circuit path. The method includes connecting a circuit path of the at least one circuit path in at least one loop. A first frequency at which a first type pulse traverses a loop of the at least one loop may be measured. The pulse of the first type may be generated synchronously with a first edge of a signal traversing the circuit path. A second frequency at which a second type pulse traverses a loop of the at least one loop may also be measured. The pulse of the second type being generated synchronously with a second edge of a signal traversing the circuit path.

In some embodiments, such a delay measurement technique may be used to calibrate a test system used in the manufacture of semiconductor devices, improving the process of manufacturing the semiconductor devices.

In yet a further aspect, the invention relates to an integrated circuit. The integrated circuit comprises a circuit path with a calibration element. Calibration circuitry is connectable in a loop incorporating the circuit path. That calibration circuitry includes an edge-triggered element and circuitry configured to measure a rate at which a signal edge propagates around the loop.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 5 is a truth table illustration operation of a true edge-triggered SR flip-flop operating according to the timing sequence illustrated in FIG. 4;

FIG. 7A is a truth table illustrating operation of the Y-latch components of FIG. 6;

FIG. 7B is a truth table illustrating operation of the Q-latch component of FIG. 6.

DETAILED DESCRIPTION

Figure 1A:
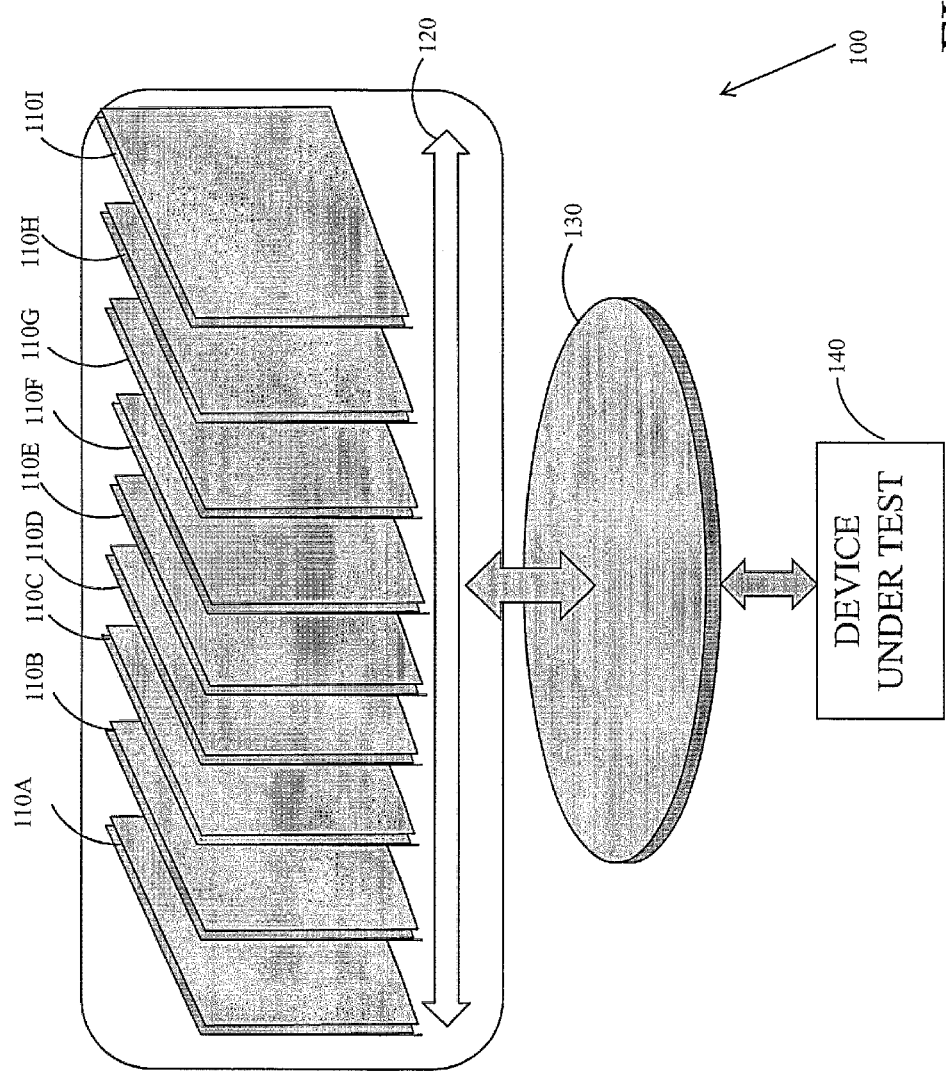
FIG. 1A is a schematic illustration of an exemplary embodiment of an automatic test system.

The inventors have recognized and appreciated advantages of circuitry and methods for measuring edge-sensitive delays in an electronic system. The capability to measure edge-sensitive delays, for example, may be applied in calibrating electronic circuitry for delays. The measurements may be used to adjust propagation delay through a circuit path for each edge separately. Timing of either or both of a rising and falling edge may be adjusted in this way.

For circuitry that responds to only one trigger edge, either a rising or falling trigger edge, calibrating for the propagation delay of the trigger edge can lead to more accurate operation. Conventional delay measurement techniques, particularly for circuit paths processing differential signals, tend to report an average edge propagation time for both a rising and falling edge. Adjusting to provide a desired average propagation delay for rising and falling edges combined does not necessarily lead to accurate operation when the edges are used separately as trigger edges. The inventors have further recognized and appreciated that the difference between calibration based on propagation delay of a trigger edge versus average delay of rising and falling edges can have more of an impact as signal frequencies increase, because the period becomes smaller and inaccuracies associated with the trigger edge become a more significant percentage of the period. Such a scenario may occur within an automatic test system, which operates at high frequencies in order to fully test many types of semiconductor devices.

Though, edge-sensitive delay measurements may be important in other contexts. As another example, a pulse has both a rising and a falling edge. If the rising and falling edges propagate through a circuit path at different rates, the time between the rising and falling edge may shrink or expand, leading to a change in the shape of the pulse, which may be undesirable in some scenarios.

Differences in propagation delay for rising and falling edges can arise in various ways. For example, differences can arise because of bias levels used in a circuit path. As a specific example, the transistors in a differential input stage of a logic element may be biased such that a transistor that turns on in response to a rising edge turns on faster than a transistor that turns on in response to a falling edge. As a result, the propagation delay of a rising edge may be less than the propagation delay of a falling edge. In this case, adjusting the bias level can calibrate for edge-specific delays by equalizing the turn on time for transistors that respond to rising and falling edges. Using other techniques to then calibrate for average delays may lead to a desired propagation delay for both the rising and falling edges. Accordingly, calibration of the circuit path may include writing into a non-volatile memory a value that controls the bias level to equalize rising and falling edge delays instead of or in addition to using other calibration techniques.

In some embodiments, the bias levels that are adjusted may represent bias voltages. In other embodiments, the bias levels that are adjusted to alter edge-sensitive delays may be bias current levels. In addition to adjusting bias levels, other circuit parameters may be adjusted to adjust edge-sensitive delays. In some embodiments, known techniques may be used, such as changing resistance or capacitance. When edge-sensitive delay measurements are used as part of a calibration process, these and other techniques may be used to adjust one or more circuit parameters to account for edge-sensitive delays. Any suitable adjustment techniques may be used, and the specific adjustment techniques used in any circuit path may depend on the design of the circuit path.

Such delay measurement and calibration techniques may be used in any suitable type of electronic system, including in an automatic test system. In an automatic test system, there are multiple channels. More accurate tests may be made if calibration techniques are used for each channel to ensure that differences in edge-sensitive delays do not lead to inaccuracies in the timing of operation to generate or measure test signals in different channels.

FIG. 1A is a schematic illustration of an automatic test system in which edge-sensitive delay calibration techniques may be applied based on edge-sensitive delay measurements. FIG. 1A illustrates a test system 100 that contains multiple instruments, of which instruments 110A . . . 110I are illustrated. Each of the instruments may contain circuitry to generate and/or measure a test signal for a device under test 140. The specific function of each instrument is not crucial to the invention, and any suitable type of instruments may be used in test system 100. Instruments 110A, 110B . . . 110I, for example, may include multiple types of instruments, with different ones of the instruments generating or measuring different types of analog or digital signals.

It should be appreciated that FIG. 1A is a greatly simplified representation of an automatic test system. For example, though no illustrated, test system 100 may include control circuitry that controls operation of instruments 110A . . . 110I. Additionally, test system 100 may include processing circuitry to process measurements and determine whether a device under test 140 is operating correctly. Moreover, it should be appreciated that, though nine instruments 110A . . . 110I are illustrated, test system 100 may include any number of instruments or other resources for generating and/or measuring test signals. Further, though FIG. 1A illustrates a scenario in which a single device under test 140 is being tested, automatic test system 100 may be configured to test multiple devices.

Regardless of the number of instruments or other components generating or measuring test signals and the number of devices under test, test system 100 may include signal delivery components that route the signals between the devices under test and the instruments. In the example of FIG. 1A, the signal delivering components are illustrated as a bus 120 and a device interface board 130. However, it should be appreciated that the signal delivery portions of test system 100 may include different or additional components.

Test system 100 may be constructed in any suitable way, including using techniques as are known in the art.

Though greatly simplified, FIG. 1A illustrates a scenario in which edge-sensitive calibration techniques may be used. Different signals used in testing even a single device under test may propagate through different channels of the test system. Different channels may be implemented using different ones of the instruments 110A . . . 110I such that different channels encompass different circuit paths through different components. Even when different channels are implemented in the same instrument, the channels may have different circuit paths passing through different components. Because different components in different circuit paths may have different amounts of delay, each channel may be subject to different amounts of delay.

Figure 1B:
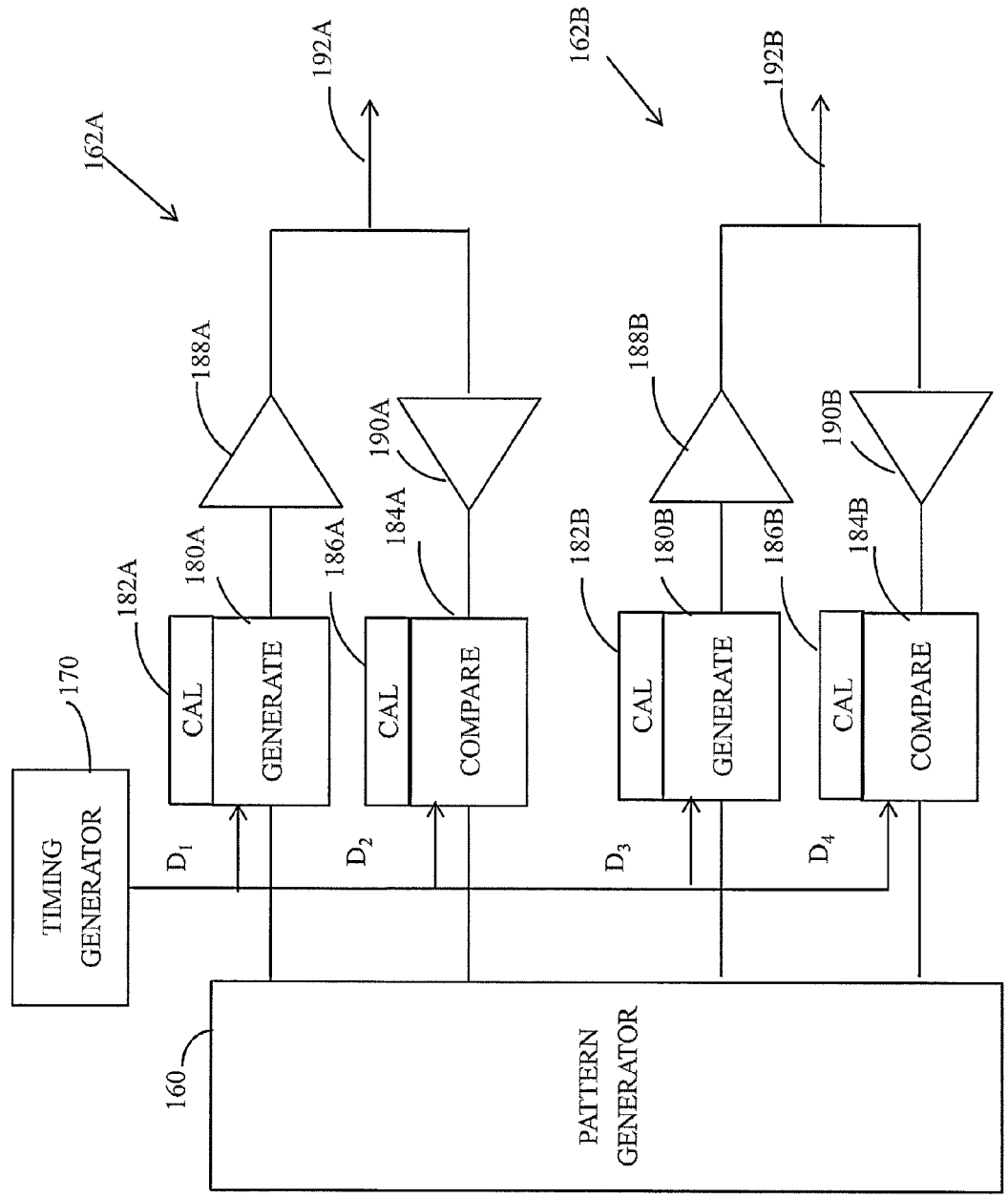
FIG. 1B is a schematic illustration of an exemplary embodiment of a portion of an automatic test system illustrating multiple signal paths that may be calibrated based on edge-sensitive measurements of delay.

FIG. 1B schematically illustrates a portion of two channels, 162A and 162B. In this example, channels 162A and 162B may represent channels in a digital test instrument. Channels 162A and 162B may generate and/or measure a digital signal at an input/output (I/O) line 192A or 192B, respectively, coupled to device under test 140 (FIG. 1A). It should be appreciated that FIG. 1A shows two channels for simplicity. A digital test instrument may contain eight or more digital channels. Moreover, an automatic test system may contain multiple digital instruments such that test system 100 (FIG. 1A) may include hundreds or thousands of digital channels. Nonetheless, the illustration of channels 162A and 162B illustrates that the use of timing calibration can improve the performance of an automatic test system.

In the example of FIG. 1B, the digital instrument includes a pattern generating 160. Pattern generator 160 may be programmed, for each test to be executed, with a pattern of digital signals to generate or measure in each of channels 162A and 162B. Pattern generator 160 works in conjunction with a timing generator 170. In the example illustrated, pattern generator 160 may output values controlling each of the channels in each of the multiple cycles of tester operation. The values may indicate for each channel an operation of that channel associated with the cycle. The values, for example, may indicate that circuitry within the channel is to drive an I/O line, such as output line 192A or 192B, coupled to a test point on a device under test. In addition, the output of pattern generator 160 may indicate a value to drive on the I/O lines 192A or 192B. Alternatively, the values output by pattern generator may indicate that each channel is to measure a signal on the I/O lines 192A or 192B.

Timing generator 170 may also be programmable. The programming of timing generator 170 may indicate when, relative to the start of each channel, the operation specified by the output of pattern generator 160 is to occur.

To support these functions, each of the channels 162A and 162B includes circuitry to generate a test signal on an I/O line of the channel or to compare the signal sensed on the I/O line to a value provided by pattern generator 160. For example, channel 162A includes circuitry 180A for generating a test signal having a format specified by an output of pattern generator 160. The time at which such a test signal is generated may be controlled by outputs of timing generator 170. This formatted test signal may be passed through a buffer amplifier 188A or other suitable circuitry to I/O line 192A. Channel 162B similarly includes circuitry 180B to generate a test signal in a specified format and a buffer 188B to drive an I/O line 192B.

Each channel includes comparison circuitry that may operate during test cycles in which pattern generator 160 specifies that a test signal on the I/O line of a channel is to be measured. For example, compare circuitry 184A may receive a value at I/O line 192A through a buffer 190A. Compare circuitry 184A may compare that sense value to an expected value provided to compare circuitry 184A by pattern generator 160. This compare operation may occur at a time specified by one or more signals output by timing generator 170. Accordingly, compare circuitry 184A may produce a value indicating whether input/outline 192A had an expected value at a designated time.

Channel 162B similarly has compare circuitry 184B. Compare circuitry 184B receives a value of a test signal at I/O line 192B through buffer 190B. The timing of operation of compare circuitry 184B is similarly controlled by outputs of timing generator 170.

In this way, both the type of operations performed in each channel and time at which those operations are performed may be specified by the programming of pattern generator 160 and timing generator 170. Though the timing of operations in the different channels is specified from a common timing source, timing generator 170 in this example, differences in propagation delays may cause the operations programmed to occur at the same time to actually occur at different times. FIG. 1B illustrates as a simple example that generate circuitry 180A is closer to timing generator 170 than compare circuitry 184B. As a result, a propagation delay of a timing signal from timing generator 170 to comparator circuitry 184B may entail a delay of $D_4$. In contrast, the delay to generate circuitry 180A may entail a delay $D_1$, which may be less than $D_4$. Other components in other channels may have different amounts of delay. For example, the delay to comparator circuitry 184A may be $D_2$ and the delay to generate circuitry 180B may be $D_3$.

In addition to delays in propagation of timing signals reaching the different components, the circuits themselves may operate with different propagation delays. Random variations in the components used to implement the circuitry illustrated in FIG. 1B may result in different operating speeds of those components. For example, generate circuitry 180A may respond more rapidly to a command to drive a data value than generate circuitry 180B. These differences may exist, even though the circuitry is designed to operate in the same way.

Differences in delay through different channels of an automatic test system may impact the accuracy of test results. For example, a test may involve determining whether a device under test responds to an input within a specified amount of time. To perform such a test, the input signal may be generated in one channel of the automatic test system. For example, channel 162A may be programmed to generate a desired input on a desired I/O line 192A. The response of the device under test may be measured in a different channel. For example, channel 162B may be programmed to measure the response on I/O line 192B. In this case, channel 162A may be programmed to generate the signal at a first time and channel 162B may be programmed to measure the output to determine whether the expected response occurred at a second time. The second time may be programmed such that it occurs an amount of time after the first time that represents the expected response time of the device under test. However, if there are different delays associated with channels 162A and 162B, the intended time difference between the operations performed at channels 162A and 162B is not maintained. For example, if there is less delay in channel 162B than through channel 162A, the response of the device under test may be measured sooner relative to the applied input than intended. Conversely, if the delay through channel 162B is greater than the delay through 162A, the measurement may occur later relative to the input than expected. Either case may result in an inaccurate test result because of the test system checking for an expected result other than at the programmed time.

Accordingly, it is known in the art to include calibration circuitry associated with the channels of an automatic test system. Techniques may be used to measure delay through each channel and the calibration circuitry may be adjusted to change the amount of delay through each channel. Accordingly, FIG. 1B illustrates calibration circuitry at 182A associated with generate circuitry 180A. Calibrate circuitry 186A is shown associated with compare circuitry 184A. Likewise, calibration circuitry 182B and 186B is shown associated with generate circuitry 180B and 184B, respectively. In operation, relative delays through each of the channels may be measured and calibration values may be determined and used to adjust calibration circuitry, such as calibration circuitry 182A, 182B, 186A and 186B. The calibration values, for example, may be written as digital values stored in non-volatile memory or other suitable storage structures within the calibration circuitry. Though, it should be appreciated that any suitable adjustment techniques may be used in calibration circuitry in the different channels, including using techniques as are known in the art.

Figure 2:
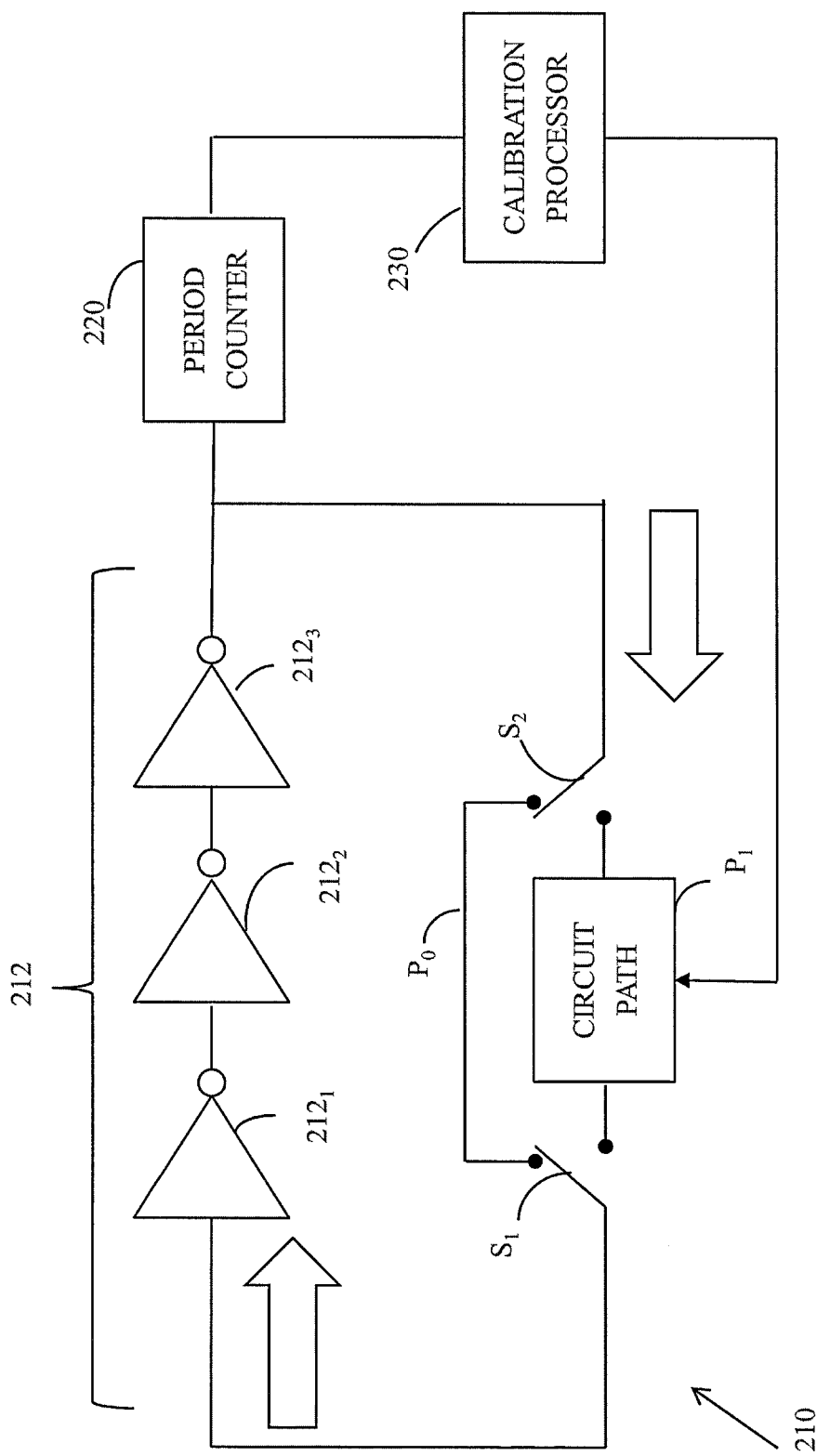
FIG. 2 is a schematic illustration of an exemplary embodiment of calibration circuitry within an automatic test system using conventional delay measurement techniques.

Regardless of how calibration values are applied to the circuitry, the values may be selected so as to equalize delays through the channels. To determine appropriate values, a technique may be employed to measure relative delays in one or more channels. FIG. 2 illustrates conventional calibration circuitry that may be employed to measure relative delays. The calibration circuitry of FIG. 2 has a configuration sometimes described as a Ring-oscillator Low Frequency, or "RLF," loop. To measure a delay in a circuit path $P_1$, the circuit path is switch into a loop 210. In this example, circuit path $P_1$ may be switched into loop 210 by appropriate configuration of switches $S_1$ and $S_2$. When circuit path $P_1$ is not switched into loop 210, a circuit path $P_0$ may be connected in loop 210.

In this example, path $P_0$ is shown to contain no circuit elements. Accordingly, while circuit path $P_1$ may include circuit elements that introduce a propagation delay when switched into loop 210, circuit $P_0$ is shown as introducing no delay and may act as a reference circuit path. Behavior of loop 210 may be measured with circuit path $P_1$ included in the loop and without that circuit path in the loop. Accordingly, the effect of circuit path $P_1$ on the operation of loop 210 may be determined by measurements with circuit path $P_1$ switched into the loop and with circuit path $P_0$ switched into the loop. The difference between these measurements may indicate an effect of circuit path $P_1$. Specifically, the difference may represent a delay introduced by switching path $P_1$ into the loop.

In this example, path $P_0$ is shown to contain no circuit elements. Path $P_0$ serves as a reference path P such that delays introduced by other paths may be measured in relation to the amount of delay introduced by path $P_0$. It should be appreciated that relative delays may be measured regardless of whether path $P_0$ introduces a delay. Accordingly, the specific makeup of reference path $P_0$ is not critical to operation of the delay measurement circuit illustrated in FIG. 2.

In the example of FIG. 2, the characteristic of loop 210 that is measured is the amount of time required for a signal to propagate around loop 210. A signal may be initiated in the loop in any suitable way. In some embodiments, a signal, such as a pulse, may be injected into loop 210 by an input element, not expressly illustrated in FIG. 2. In other embodiments, loop 210 may be inherently unstable such that a signal may be initiated by electronic noise in loop 210 without any express input.

Regardless of the manner in which a signal is initiated in the loop, other components of the loop 210 may be configured to maintain the signal propagating around loop 210. The other components, in this example, include a delay chain 212. Delay chain 212 is made of inverters $212_1$, $212_2$ and $212_3$. Though three inverters are shown, it should be appreciated that any suitable number of inverters may be included in delay chain 212. Further, though inverters are shown, it should be appreciated that any suitable components may be included in delay chain 212.

In this example, the elements in delay chain 212 are selected such that a signal input to delay chain 212 produces an output of delay chain 212 that is inverted, and when applied at the input of circuit path $P_1$ causes circuit path $P_1$ to again output a signal that is inverted relative to its original output. Repeating the same process once more leads to an output signal of circuit path $P_1$ that is of the same polarity as its original output. This process may repeat indefinitely, with the signal and its inverse periodically passing any specific point in loop 210, with a period equal to the sum of the propagation delay around the loop of a rising edge and the propagation delay of a falling edge. The time between signals appearing at any specific point will depend on the propagation delay of the signal around loop 210.

With circuit path $P_1$ switched into loop 210, the period between signals will be longer than when reference circuit path $P_0$ is switched into loop 210. By measuring a change in the period of the signal when path $P_1$ is included in the loop relative to when reference circuit path $P_0$ is included in the loop, the increase in delay associated with switching circuit path $P_1$ into the loop may be determined.

The amount of delay will be related to the increase in the period of the signal passing through loop 210. To measure the period, the calibration circuitry of FIG. 2 includes a period counter 220. Period counter 220 may be implemented in any suitable way. In this example, period counter 220 is a counter that is clocked by a signal leaving delay chain 212. To determine the period, the counter may be operated for a known interval of time. That interval, divided by the number of the signal counted gives an indication of the time between signals passing around loop 210.

Delay chain 212 may be constructed in any suitable way to ensure that a signal exiting circuit path $P_1$, which is then input to delay chain 212, causes an output of delay chain 212 that can be applied to circuit path $P_1$ to cause it to regenerate the signal. In the embodiment illustrated, delay chain 212 includes an odd number of inverter elements. This configuration inverts the input to circuit path $P_1$, which inverts the output of circuit path $P_1$. This operation may be appropriate if circuit path $P_1$ outputs a non-inverted version of the signal in response to the inverted input. Though, it should be appreciated that the delay chain 212 may have any suitable configuration and the specific configuration may be selected based on the operation of circuit path $P_1$.

The calibration operation may be controlled by any suitable circuitry. In this example, calibration processor 230 is illustrated. Calibration processor 230 may represent a circuit component incorporated into an automatic test system. Alternatively or additionally, calibration processor 230 may be implemented as part of a general purpose computer programmed to operate a test system, such as test system 100 (FIG. 1A).

Regardless of the specific implementation of calibration processor 230, calibration processor 230 may operate to connect reference path $P_0$ into loop 210 and control period counter 220 to measure the period of signals oscillating within loop 210. Calibration processor 230 may capture this value and then operate switches $S_1$ and switches $S_2$ to disconnect reference path $P_0$ from loop 210 and connect circuit path $P_1$ in loop 210. Calibration processor 230 may then again read the output of period counter 220. By comparing the outputs of period counter 220 with reference path $P_0$ and circuit path $P_1$ in loop 210, calibration processor 230 may determine an amount of delay, relative to a reference amount of delay, associated with circuit path $P_1$. Calibration processor 230, based on this calculated amount of delay, determines one or more calibration values for circuit path $P_1$. Calibration processor 230 may be programmed to compute the calibration values such that, when applied to circuit path $P_1$, the delay through circuit path $P_1$ achieves some nominal value. Calibration processor 230 may compute the calibration values in any suitable way, including through an iterative process under which calibration processor 230 programs different calibration values into circuit path $P_1$ until the measured delay equals the nominal value.

Though not expressly shown in FIG. 2, the calibration circuitry may be configured to connect multiple circuit paths within loop 210. Calibration processing may entail setting calibration values for each path to achieve equal delays in all circuit paths. In this way, compensation may be provided for different propagation delays, switching speeds or other effects that could impact propagation delay differently in different ones of the circuit paths.

Figure 3:
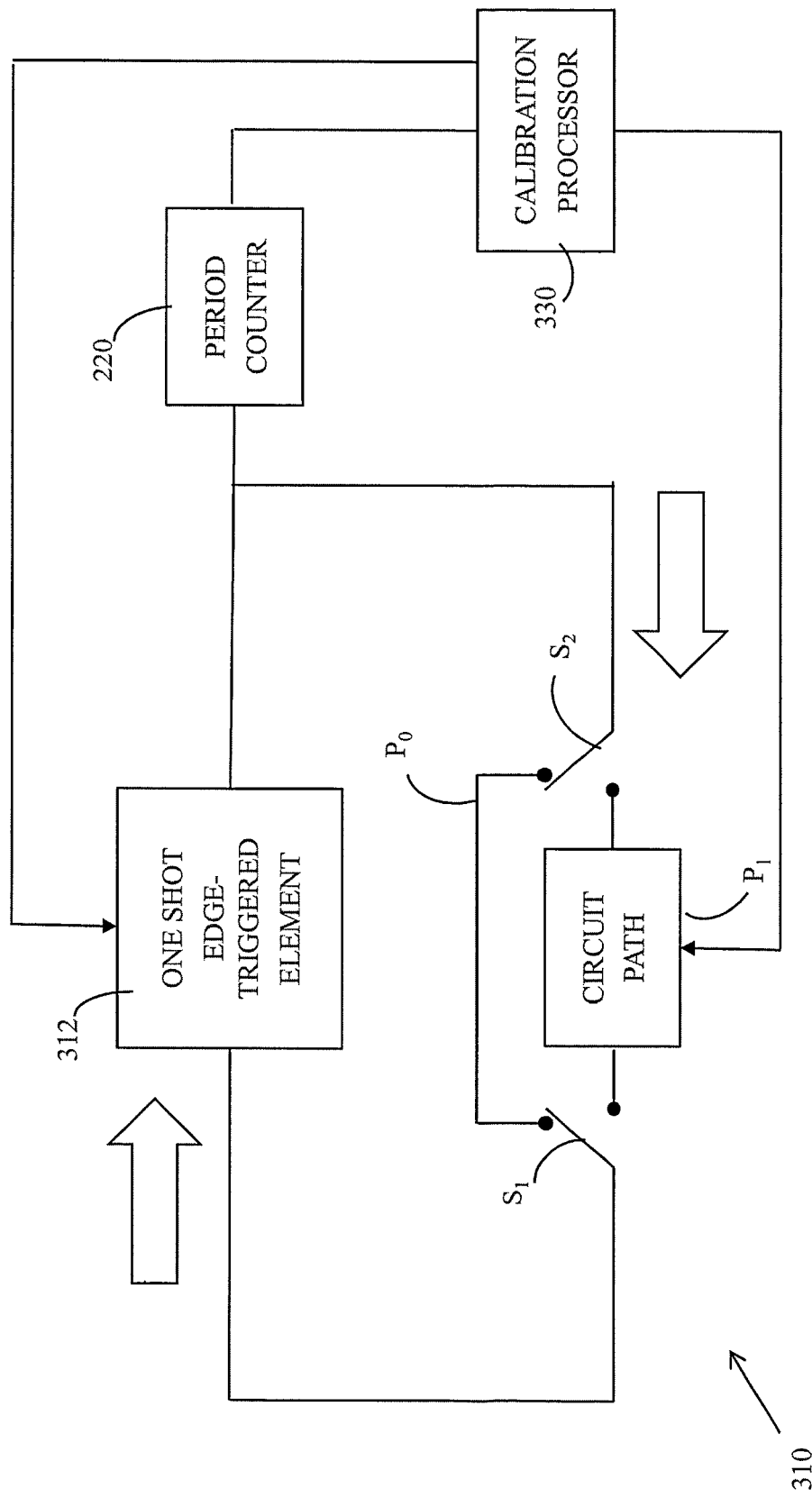
FIG. 3 is a schematic illustration of an exemplary embodiment calibration circuitry to calibrate for edge-sensitive delay.

The calibration circuitry in FIG. 2 uses a conventional calibration technique. The inventors have recognized and appreciated that, by adapting the circuitry of FIG. 2, edge-sensitive delays can be measured. With these measurements, edge-sensitive calibration can be performed. FIG. 3 illustrates an embodiment of calibration circuitry configured for edge-sensitive delay measurement and edge-sensitive calibration.

The calibration circuitry of FIG. 3 similarly includes a reference circuit path $P_0$ and in a circuit path $P_1$ for which the delay may be measured relative to the reference circuit path $P_0$. Either of the paths may be switched into loop 310 by operation of switches $S_1$ and switches $S_2$. Calibration circuitry of FIG. 3 similarly operate by causing a signal to repeatedly propagate around loop 310. Accordingly, a relative delay in circuit path $P_1$ may be measured by determining a period of a signal propagating around loop 310. Accordingly, period counter 220 may be coupled to loop 310. The output of period counter 220 may be read by calibration processor 330. Like calibration processor 230, calibration processor 330 may be programmed to measure a delay through one or more circuit paths and determine a calibration value to apply to that circuit path in order to achieve a desired delay. The process may be performed for multiple circuit paths to equalize delay through the paths.

However, in contrast to the configuration circuitry illustrated in FIG. 2, calibration processor 330 may be configured to determine calibration values that set delay of edges of a particular type propagating through circuit path $P_1$. For example, calibration processor 330 may determine a delay associated with a rising edge propagating through circuit path $P_1$. In other scenarios, calibration processor 330 may set calibration values to calibrate for a delay of a falling edge through circuit path $P_1$. Yet a further possibility, calibration processor 330 may separately measure delays associated with a rising edge and a falling edge propagating through circuit path $P_1$ and set calibration values to achieve a desired propagation delay for each of the rising edge and the falling edge. The same processing may be repeated for other circuit paths, thereby providing edge-sensitive calibration of multiple circuit paths.

In the embodiment illustrated, calibration processor 330 is enabled to measure edge-sensitive delays through the incorporation of an edge triggered element within loop 310. The edge triggered element responds to a trigger edge at its input. The trigger edge may be either a rising edge or a falling edge. In some embodiments, one shot edge triggered element 312 may be configurable so as to, at any given time, respond to either a rising edge or a falling edge, but not both. With such an edge triggered element in loop 310, calibration processor may calibrate circuit path $P_1$ for rising edge delays by configuring the edge triggered element to respond to rising edges. Calibration processor 330 may then reconfigure the edge triggered element to respond to falling edges, and repeat a delay measurement for calibration of delays associated with propagation of falling edges.

In the example of FIG. 3, the edge triggered element within loop 310 is a one shot edge triggered element 312. In response to receiving a trigger edge at its input, one shot edge triggered element 312 may produce a pulse at its output. The width of the pulse may be dependent on the design of one shot edge triggered element 312 and may be independent of the format of the input signal to one shot edge triggered element 312. Loop 310 may be configured such that each pulse output by one shot edge triggered element 312 and then applied as an input to circuit path $P_1$ causes circuit path $P_1$ to output a signal including another trigger edge. In this way, a process by which one shot edge triggered element 312 repeatedly outputs pulses is initiated. As with loop 210, the period of these pulses may depend on the delay through the elements making up loop 310.

One shot edge triggered element 312 may be constructed in any suitable way. However, the inventors have recognized and appreciated that traditional one shot circuits may lead to the disappearance of an initially present loop signal, and that an implementation based on a modified SR flip-flop design may be preferable in some embodiments. An SR flip-flop has a set input, S, and a reset input, R. In a standard SR flip-flop, when the S input is asserted, the output of the flip-flop is asserted. Conversely, when the reset input is asserted, the output is de-asserted. When neither of the S or R inputs is asserted, the SR flip-flop maintains its state. In a standard SR flip-flop, asserting both the S and R inputs is not a valid operation. Accordingly, if the S and R inputs are simultaneously asserted in a standard SR flip-flop, the output is indeterminate. An example of an indeterminate output is a state that is in between a logic high level and a logic low level. In general, an indeterminate output state is any output state that leads to unpredictable behavior of subsequent circuitry.

Figure 4:
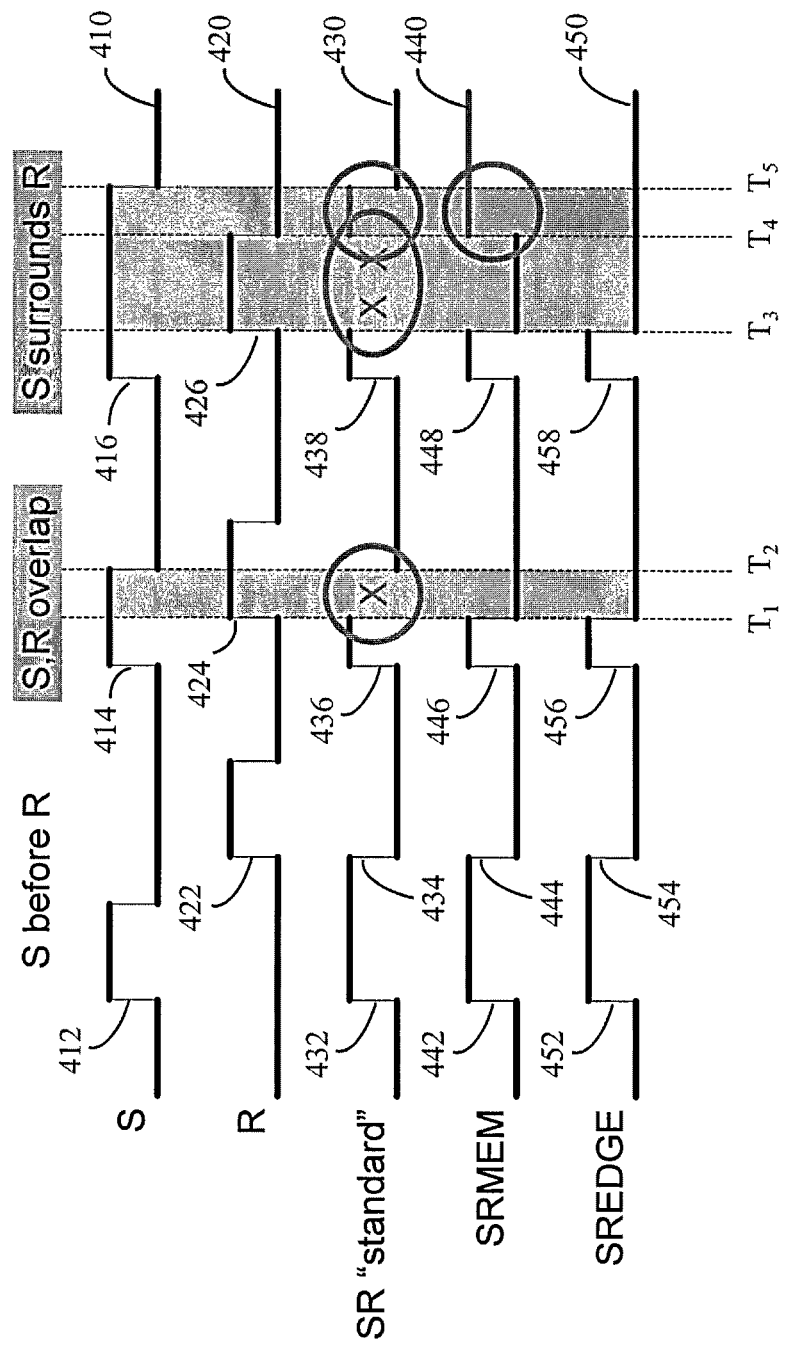
FIG. 4 is a sketch of a timing diagram showing a comparison of the operation of a standard SR flip-flop and a true edge triggered SR flip-flop, that may be used in implementing a one shot edge triggered element of FIG. 3.

FIG. 4 illustrates various operating states of a standard SR flip-flop. Timeline 410 illustrates a signal at the S input of a standard SR flip-flop. Timeline 420 illustrates the signal at the R input of the SR flip-flop. In the illustrated example, edge 412 indicates the time at which S input is asserted. Accordingly, the output shown on timeline 430 has a corresponding edge 432 indicating that the output is set in response to the S input being asserted.

In contrast, edge 422 indicates the beginning of a time when the R input is asserted. Accordingly, the output has a falling edge 434, indicating that the output is de-asserted in response to the R input being asserted.

Timeline 440 illustrates a desired behavior for a true edge triggered SR flip-flop in which the output is set or reset in response to trigger edges in the S and R inputs. The output in a true SR triggered flip-flop may respond to the most recent trigger edge in either the S or R signal. When the most recent trigger edge occurs on the set input, the output of a true SR triggered flip-flop will be set. When the most recent trigger edge is on the R input, the output of a true SR edge triggered flip-flop will be reset.

Timeline 440 illustrates that behavior in response to trigger edges 412 and 422 on the S and R inputs, respectively. The output of the true SR edge triggered flip-flop illustrated on timeline 440 is asserted, as illustrated by edge 442 which occurs in response to rising edge 412 on the S input. The output of the true SR edge triggered flip-flop is de-asserted, as illustrated by falling edge 444, which occurs in response to trigger edge 422 of the R input. In the scenario in which the S and R inputs do not occur at the same time, the output of the standard SR flip-flop is the same as a true SR edge triggered flip-flop. However, if the S and R inputs are asserted at the same time, the operation of a standard SR flip-flop may not match that of a true SR edge triggered flip-flop.

In the scenario illustrated, the S input is de-asserted before the R input is asserted at edge 422 such that the S and R inputs are not asserted at the same time. So long as the S and R inputs are not asserted simultaneously, a standard SR flip-flop exhibits an edge triggered behavior, with the output being asserted in response to a rising edge on the S input and is de-asserted in response to a rising edge on the reset input. Other combinations of the S and R input are illustrated in which the S and R inputs are simultaneously asserted. If the S and R inputs are asserted at the same time, a standard SR flip-flop may not exhibit true edge-triggered behavior. FIG. 4 indicates scenarios in which the S and R inputs occur simultaneously. These scenarios can take the form of the R input partially overlapping the S input or the S input surrounding the R input. Overlap is illustrated in connection with rising edges 414 and 424.

Timeline 410 includes an edge 414 at which the S input is asserted. Timeline 420 includes and edge 424 at which the R input is asserted. In contrast to edge 422, edge 424 occurs at a time $T_1$ at which S input is still asserted. Accordingly, though the output of the standard SR flip-flop, as illustrated on timeline 430, has an edge 436 in response to the S input being asserted, a standard SR flip-flop may maintain that state only until time $T_1$ at which the R input is asserted. At time $T_1$, lasting until time $T_2$, both the S and R inputs are asserted. Accordingly, the output of a standard SR flip-flop is indeterminate between time $T_1$ and time $T_2$. Though, at time $T_2$ the output resets because the R input remains asserted at time $T_2$ while the S input is de-asserted.

Timeline 440 represents the output of a prior-art SR flip-flop that responds correctly to partially overlapping S and R inputs illustrated on timelines 410 and 420. This latch is disclosed in U.S. Pat. No. 6,291,981 B1 by R. A. Sartschev, which is hereby incorporated by reference. In response to a trigger edge 414 on the S input, the output of the true SR edge triggered flip-flop shows a rising edge 446. The output of the prior-art SR flip-flop stays asserted until the next trigger edge on the R input, which is trigger edge 424 in the example illustrated. Accordingly, the output of the prior-art SR flip-flop is de-asserted at time $T_1$ in response to the trigger edge 424 on the R input.

Timeline 450 represents a desired behavior of a true SR edge triggered flip-flop in response to the overlapping S and R inputs illustrated on timelines 410 and 420, similar to the behavior of the prior-art SR flip-flop. In response to a trigger edge 414 on the S input, the output of the true SR edge triggered flip-flop shows a rising edge 456. The output of the true SR edge triggered flip-flop stays asserted until the next trigger edge on the R input, which is trigger edge 424 in the example illustrated. Accordingly, the output of a true SR edge triggered flip-flop is de-asserted at time $T_1$ in response to the trigger edge 424 on the R input. In contrast to a standard SR flip-flop in which the output is indeterminate during the period of overlap between times $T_1$ and times $T_2$, the prior-art SR flip-flop and a true SR edge triggered flip-flop have a de-asserted output between times $T_1$ and times $T_2$.

The S input may surround the R input as is illustrated in connection with edges 416 and 426. In this example, the S input is asserted at edge 416 and stays asserted until time $T_5$. The R input is asserted time $T_3$, represented by edge 426. The R input stays asserted until time $T_4$. As can be seen in the surround scenario, a standard SR flip-flop also does not exhibit a true edge triggered behavior in which the flip-flop responds to the most recent edge. As can be seen, in response to edge 416 on the S input, the output is asserted with an edge 438. This behavior corresponds to the behavior of a true edge triggered SR flip-flop in which the output depends on the most recently received edge. Timeline 440 and 450 also illustrate this desired behavior with rising edges 448 and 458 respectively representing the output being asserted in response to the rising edge 416 of the S input. As illustrated on timeline 440, in the prior-art SR flip-flop, and on timeline 450, in a true edge triggered SR flip-flop, the output is de-asserted in response to the next rising edge of the R input. This rising edge is shown as edge 426 occurring at time $T_3$. Accordingly, timeline 440 shows the output of the prior-art SR flip-flop being de-asserted at time $T_3$ and timeline 450 shows the output of the true SR edge triggered flip-flop being de-asserted at time $T_3$. In contrast, for a conventional. SR flip-flop this desired behavior may not occur when the reset input is surrounded by the S input. As can be seen, when the R input is asserted at rising edge 426, both the S and R inputs are asserted during the time $T_3$ through time $T_4$. Rather than being reset as illustrated in timeline 440, the output of a standard SR flip-flop as illustrated in timeline 430, becomes indeterminate in the time between times $T_3$ and times $T_4$.

FIG. 4 illustrates a further deviation from the desired behavior when a standard SR flip-flop is used. At time $T_4$, the reset input is de-asserted. However, the S input remains asserted until time $T_5$. During the interval time $T_4$ one time $T_5$, a standard SR flip-flop will have an asserted output, as illustrated in timeline 430. However, no rising edge of the set input occurs of the time $T_4$. Accordingly, as illustrated in timeline 440, the true edge triggered SR flip-flop remains in a reset state between times $T_4$ and times $T_5$.

The prior-art SR flip-flop behaves like a true edge triggered SR flip-flop before time $T_4$. At time $T_4$, the reset input is de-asserted. However, the S input asserts at that time and remains asserted until time $T_5$. As in the case of the standard SR flip-flop, during the interval time $T_4$ one time $T_5$, the prior-art SR flip-flop will have an asserted output, as illustrated in timeline 440. This is a deviation from the desired true edge triggered behavior.

The inventors have recognized and appreciated that an edge triggered element used for edge-sensitive delay measurements, such as edge triggered element 312 (FIG. 3) may be implemented with a true SR flip-flop having the behaviors illustrated on timeline 440. FIG. 5 illustrates a truth table for such an edge triggered element.

FIG. 5 illustrates a truth table for a true edge triggered SR flip-flop that may be used as part of an edge triggered element in an edge-sensitive delay measurement circuit. An edge triggered SR flip-flop like a conventional SR flip-flop has an S and an R input. The true SR edge triggered flip-flop has an output Q. The truth table of FIG. 5 shows values of the output Q at time n. Values of the output Q at time n are indicated in the column headed Qn. Values of the S and R inputs at the time n are indicated in the columns headed Sn and Rn, respectively. FIG. 5 also shows input values for a time preceding the time n. The values for the S and R inputs at a time preceding time n are indicated in the columns headed Sn−1 and Rn−1, respectively. In this manner we illustrate transitions on S and R inputs with different values at times n and n−1. Time n is after the most recent transition while time n−1 is before the most recent transition, and only the most recent transition occurs between time n−1 and n. The rows 512, 514, 516, 518, 520, 521, 522 and 524 represent different combinations of the inputs Sn−1, Rn−1, Sn and Rn. Rows 512 and 514 indicate an operating state in which the set and reset inputs do not overlap. In row 512, the S input is asserted at time n, as indicated by a one in the column headed Sn while the R input is constant and de-asserted. In response to this combination of inputs, the output is asserted at time n as illustrated by a one in a column headed $Q_n$.

Row 514 illustrates a behavior when the R input is asserted at time n while the S input is constant and de-asserted. As can be seen by the zero in the column headed Qn, the output of true edge triggered SR flip-flop is de-asserted in response to this combination of inputs.

Row 516 indicates a scenario in which there is a rising edge in the S input at time n while the R input is constant and asserted. This rising edge can be seen by the value of one in the column headed Sn and the zero in the column headed Sn−1. The asserted output is represented by the value of one in the column headed Qn.

Row 518 illustrates a scenario in which a rising edge of the R input occurs at time n. This rising edge can be seen by a one in the column headed Rn in comparison to the value zero in the column headed Rn−1. No edge has occurred in the set input as can be seen by the value one in both columns headed Sn and Sn−1. The S input is constant and asserted.

Row 520 indicates a scenario in which the R input is de-asserted at time n, as can be seen by a zero in the column headed Rn and a one in the column headed Rn−1. Though the inputs represented in row 520 include an edge at time n on the R input, in the embodiment illustrated, the SR edge triggered flip-flop is sensitive to a rising edge. The edge in the R input occurring at time n based on the inputs represented in row 520 is a falling edge. Accordingly, this edge does not reset the state of the flip-flop. Similarly, there is no trigger edge on the S input, as can be seen by a one in both the columns headed Sn and Sn−1. Accordingly, at time n the output Qn is the same as at time n−1. This output is indicated by the value Qn−1 in column Qn.

Row 522 similarly illustrates a scenario in which no trigger edge occurs at time n such that the output Qn retains its state at Qn−1 since the transition of the R input involves a falling edge.

Composite row 524 similarly illustrates scenarios in which no trigger edge occurs at time n. In this example in which trigger edges are rising edges because both the S and R inputs are zero in the states illustrated in row 524, no change in the output occurs at time n. Therefore, the value of Qn stay the same as the value Qn−1 as indicated in the column headed Qn.

Figure 6:
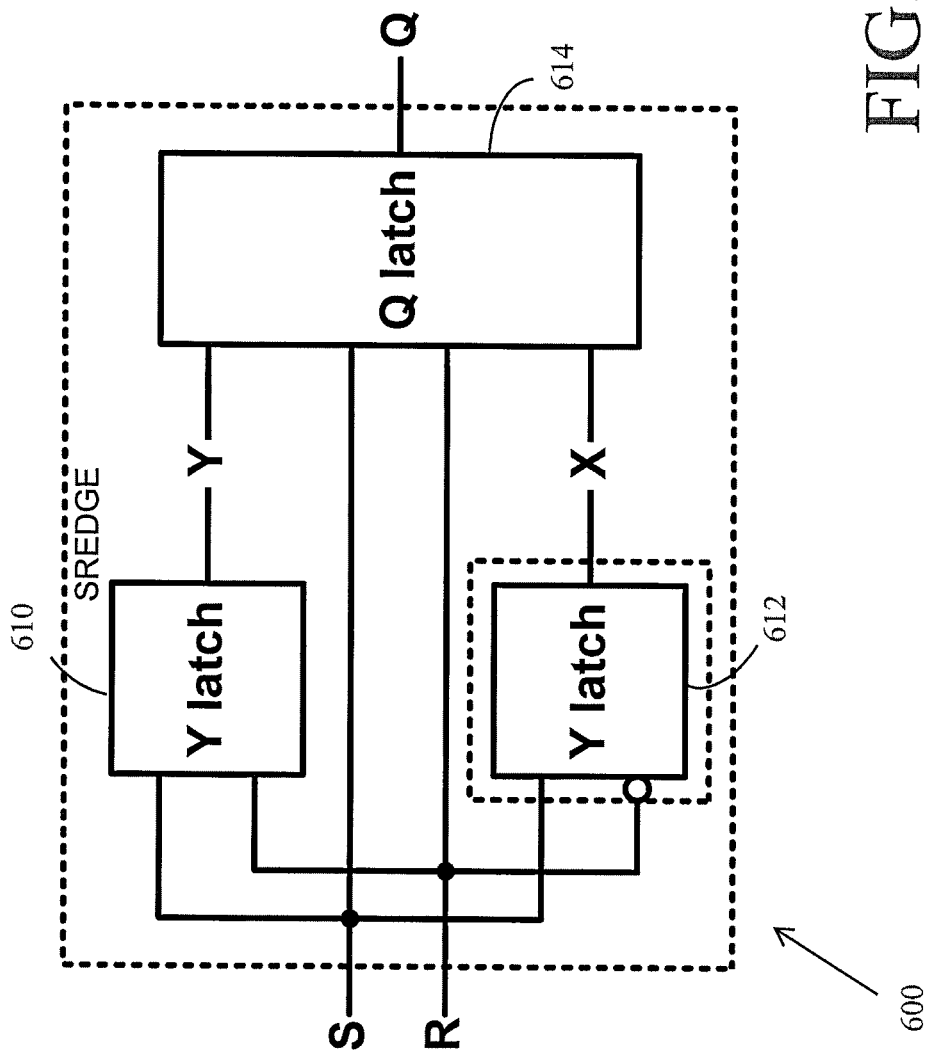
FIG. 6 is a schematic illustration of a circuit implementation of a true edge-triggered modified SR flip-flop operating according to the timing diagram of FIG. 4.

A circuit element operating according to the truth table of FIG. 5 will implement the behavior of a true SR edge triggered flip-flop. Any suitable arrangement of circuit components maybe used to implement a circuit achieving a truth table illustrated in FIG. 5. FIG. 6 provides an example of a suitable arrangement of circuit components. In this example, a true edge triggered SR flip-flop is implemented with three latches, such as a Y latch 610, a Y latch 612, and a Q latch 614. The Y latch 610 receives the S and R inputs. Y latch 612 similarly receives the S and R inputs. However, the R input is inverted upon application to Y latch 612.

The Y latch 610 output Y and the Y latch 612 output X are applied to the Q latch. In addition, the S and R inputs are received by the Q latch to produce output Q of the true SR edge triggered flip-flop 600.

FIG. 7A illustrates a truth table for the operation of Y latch 610 and Y latch 612. From the truth table of FIG. 7A it can be seen that the Y latch 610 and the Y latch 612 behave like an SR flip-flop. However, the output of the Y latch 610 and the Y latch 612 is determinant even when both the S and R inputs are asserted simultaneously. As illustrated in FIG. 7A, if the set and reset inputs are both asserted, the Y latch retains its state. This operation is illustrated in row 720. Rows 714, 716 and 718 illustrate operating states in which at most one of the S and R inputs is asserted. These rows represent operation that is the same as a standard SR flip-flop. When the S input is asserted, the output Y is asserted, as illustrated by row 716. Conversely, when the input R is asserted, the output Y is de-asserted as indicated by row 718. When neither the S nor R input is asserted, the output Y retains its state, as indicated by the value Yn−1 in row 714.

FIG. 7A also displays up front a column of assertions that are logically equivalent to the indicated values of Sn and Rn in the same row, where in general * stands for a logical AND operation and + for a logical OR operation. Although in this Y latch table no particular simplification is evident, this notation may clarify the meaning of more complex truth tables, as will become clear for the Q latch 614.

FIG. 7B illustrates a truth table for the operation of Q latch 614. The Q latch 614 does not represent an operation that is the same as a standard SR flip-flop. As illustrated in FIG. 7B it can be seen that when S*(Xb+Yb), or (NOT S) AND ((not X) OR (not Y)), is asserted, the output Q is asserted, as illustrated by composite row 722. Conversely, when R*(Xb+Y), or (NOT R) AND ((NOT X) OR (NOT Y)), is asserted, the output Q is de-asserted as indicated by composite row 724. When (Sb+Rb)*X+Sb*Rb, or (((NOT S) OR (NOT R)) AND X) OR ((NOT S) AND (NOT R)), is asserted, the output Q retains its state, as indicated by the value of Qn−1 in row 726.

The example circuit in FIG. 6 together with the truth tables in FIG. 7A and in FIG. 7B results in the complete truth table illustrated in FIG. 5, demonstrating that its operation represents that of a true edge triggered SR flip-flop.

In some embodiments, a Y latch may be constructed using an arrangement of transistors similar to that used in forming a standard SR flip-flop. The specific circuit designed may be adapted to accommodate for the operating state illustrated in row 720. However, any suitable circuit design may be used to implement a Y latch.

In some embodiments, a Q latch may be constructed using a similar yet more complex arrangement of transistors than that of the Y latch or a standard SR flip-flop. The specific circuit may be adapted to accommodate for the operating state illustrated in rows 722, 724, and 726. However, any suitable circuit design may be used to implement a Q latch.

Figure 8:
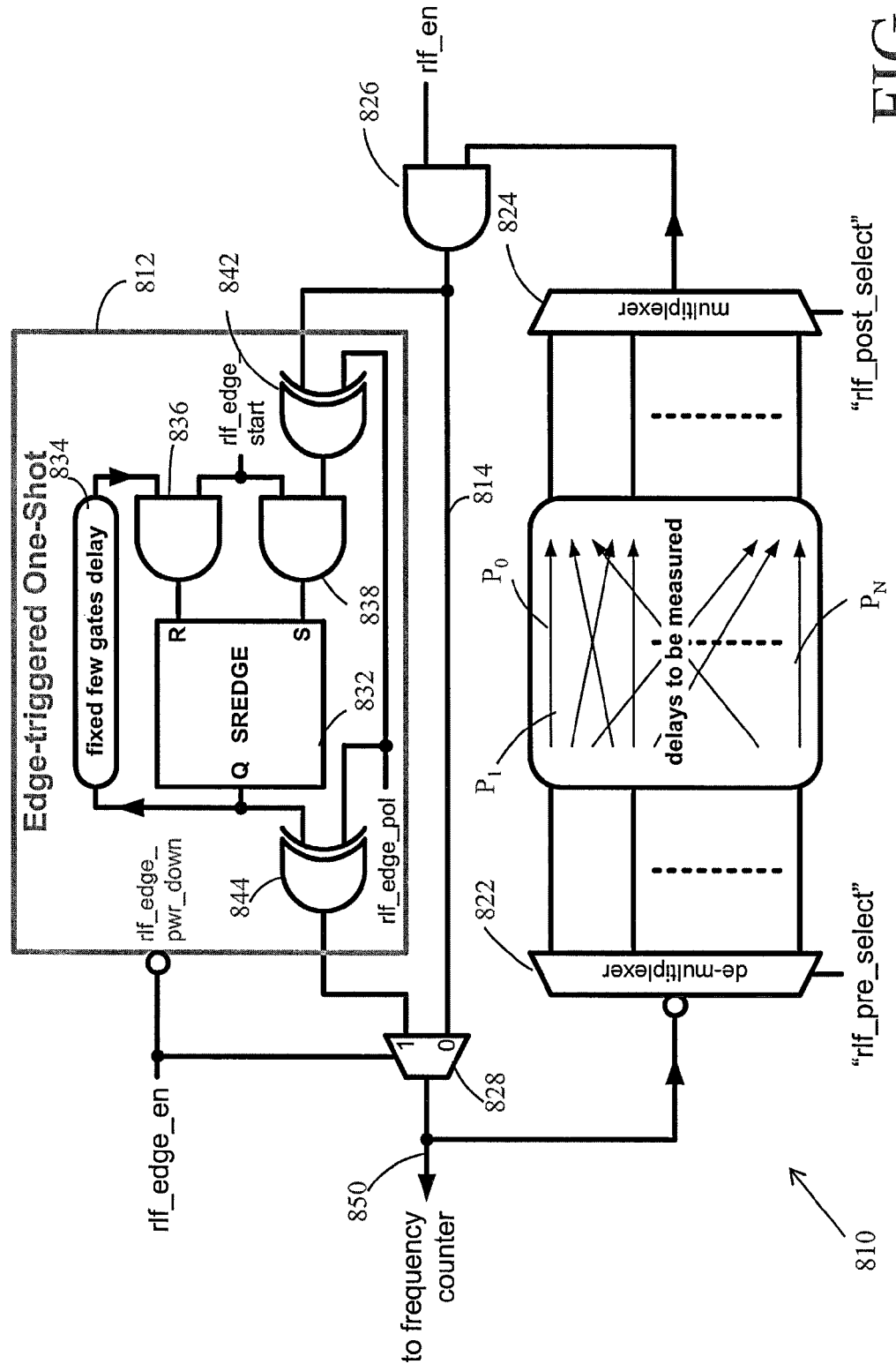
FIG. 8 is a schematic illustration of circuitry for measuring edge-sensitive delays that may be configured to measure delays associated with either a rising or falling edge.

Regardless of how a true edge-triggered flip-flop is implemented, such a device may be used for edge-sensitive delay measurements. FIG. 8 illustrates circuitry for measuring edge-sensitive delays using a true SR edge triggered flip-flop. The circuitry of FIG. 8 may be used to measure delays in any one or more circuit paths. In the embodiment illustrated, circuit paths $P_0 \ldots P_N$ are illustrated. Circuit path $P_0$ may represent a reference circuit path. The other circuit paths, such as circuit paths $P_1 \ldots P_N$, may represent circuit paths to be calibrated to remove differences in edge-sensitive delays among the circuit paths.

The specific function of the circuit paths $P_1 \ldots P_N$ may depend on the nature of the electronic system in which the circuitry of the FIG. 8 is applied. For example, if applied in connection with a test system 100 (FIG. 1A), each of the circuit paths $P_1 \ldots P_N$ may represent a portion of the circuitry within a channel of the automatic test system. The portions represented by circuit paths $P_1 \ldots P_N$, for example, be portions of digital channels controlled by a common pattern generator such as is illustrated in FIG. 1B. However, it should be appreciated that this specific structure or function of the circuit paths $P_0 \ldots P_N$ is not critical to the invention, and edge-sensitive delay measurements and calibration may be employed with any suitable type of circuit paths. As with the embodiment of FIG. 3, a path for which delay is to be measured maybe selectively switched into a loop 810. In the example illustrated in FIG. 8, the switching is achieved by de-multiplexer 822 and multiplexer 824. Control signals rlf_pre_select and rlf_post_select may be applied to de-multiplexer 822 and multiplexer 824, respectively, to control which of the circuit paths $P_0 \ldots P_N$ is connected in loop 810. These control signals rlf_pre_select and rlf_post_select may be generated by any suitable component, such as a calibration processor 330 (FIG. 3). These control signals may be configured such that de-multiplexer 822 and multiplexer 824 uniquely select one of the circuit paths $P_0 \ldots P_N$.

The loop 810 may be configured such that a one shot edge triggered element 812 is included in loop 810. For flexibility, the circuit illustrated in FIG. 8 includes components that control whether one shot edge triggered element 812 is included in loop 810 and even whether loop 810 is formed. One component that controls whether a loop is formed is AND gate 826.

AND gate 826 may, based on the input rlf_en, selectively form loop 810. When the signal rlf_en, coupled to a first input of AND gate 826, is asserted, the output of AND gate 826 will depend on the value of the signal applied at the second input of AND gate 826. If the signal at the second input of AND gate 826 is asserted, the output of AND gate 826 will also be asserted. Conversely, if the signal at the second input of AND gate 826 is not asserted, the output of AND gate 826 will similarly not be asserted. In this way, AND gate 826 will pass through a signal at the second input of AND gate 826 when the signal rlf_en is asserted.

If the signal rlf_en is not asserted, the output of AND gate 826 will remain in a deasserted state, regardless of the state of the signal at the second input to AND gate 826.

In this way, AND gate 826 will selectively pass the output of multiplexer 824 allowing loop 810 when signal rlf_en is asserted. No signal will propagate when rlf_en is not asserted.

The signal rlf_en may be controlled by any suitable component, such as by calibration processor 330 (FIG. 3). Calibration process 330 may assert rlf_en while the circuitry of FIG. 8 is used for delay measurement. When not in use for delay measurement, the signal rlf_en may be deasserted, preventing signals from being formed in loop 810, which could interfere with other elements of the electronic device in which the circuitry of FIG. 8 is included.

FIG. 8 also illustrates components and control signals that may be used for determining whether the circuitry of FIG. 8 provides an edge-sensitive delay measurement or a conventional delay measurement. In this example, loop 810 includes a multiplexer 828. Multiplexor 828 is configured to select a signal to propagate around loop 810. In the scenario illustrated, multiplexer 828 selects from between an output of edge triggered element 812 and the signal along path 814. When multiplexer 828 is controlled to select the output of edge triggered element 812, the circuitry of FIG. 8 will be configured to propagate signals around loop 810 at times synchronized with trigger edges for the edge triggered element 812. Accordingly, by operation of multiplexer 828, loop 810 may have a configuration similar to that of loop 310 (FIG. 3), which provides edge-sensitive delay measurements.

Conversely, when multiplexer 828 selects path 814, some delay in the signals propagating around loop 810 may be created along path 814. In addition, the loop 810 will have an inversion caused by demultiplexer 822 having an inverting input. Accordingly, when multiplexer 828 selects as its input path 814, loop 810 may have a configuration similar to loop 210 (FIG. 2). That loop is configured for measuring a delay equal to the sum of the delay for a rising edge and the delay for a falling edge, so twice the average delay of rising and falling edges, as in a conventional system.

In this way, by control of multiplexer 828, the circuitry of FIG. 8 may be configured to perform a conventional delay measurement or may be configured to perform an edge-sensitive delay measurement. For an edge-sensitive delay measurement, edge triggered element 812 is included in the loop. For a conventional delay measurement, edge triggered element 812 is not used. Accordingly, FIG. 8 illustrates that the control signal applied to multiplexer 828 to control whether edge triggered element 812 is included in loop 810 also controls whether edge triggered element 812 receives power. As shown, control signal rlf_edge_en is configured to disable the power to edge triggered element 812 when multiplexer 828 selects circuit path 814 for inclusion in loop 810. This capability is optional, but may reduce power consumed by an electronic device incorporating the circuitry of FIG. 8 and may reduce the generation of noise which could interfere with operation of other portions of the electronic device. The signal rlf_edge_en may be provided in any suitable way. Though, in some embodiments, the control signal rlf_edge_en may be provided by a calibration processor, such as calibration processor 330 (FIG. 3). For simplicity no other power reducing options are shown in FIG. 8, although such options may be added without changing the fundamental operation of the circuitry when activated.

Edge triggered element 812 may be implemented in any suitable way. In the embodiment illustrated, edge triggered element includes a true RS edge triggered flip-flop 832. True RS edge triggered flip-flop 832 may implement a truth table as is illustrated in FIG. 5. Such a component may be implemented with the circuit architecture illustrated in FIG. 6. However, any suitable edge triggered element may be used. In the example of RS edge triggered flip-flop 832 includes an R and an S input. Circuit components may be used with flip-flop 832 to control its operation. AND gates 836 and 838 are connected to the R and S inputs, respectively. AND gates 836 and 838 may be controlled to selectively allow or block signals from being applied to the R and S inputs. In the example of FIG. 8, a control signal rlf_edge_start is provided as an input to each of AND gates 836 and 838. When the signal rlf_edge_start is asserted, AND gates 836 and 838 will pass whatever signal is applied to the other input of each of AND gates 836 and 838. Conversely, when the control signal rlf_edge_start is deasserted, AND gates 836 and 838 will maintain the outputs of AND gates 836 and 838 in the deasserted state. Accordingly, no edges will be coupled to the R and S inputs of true RS edge triggered flip-flop 832, and the flip-flop 832 will not change state, effectively disabling edge-triggered element 812 from producing any output.

In addition, using two AND gates for the disabling purpose may create a well defined initial state $(S,R)=(0,0)$ when ref_edge_start is asserted. Note that the initial state of Q may be unknown, especially if the edge-triggered one-shot 812 just powered up. Once the system is thus enabled, and assuming external loop selections have been made, only one of inputs S and R will assert, which one depending on the initial state of Q. This avoids an undesired initial state (S,R,Q)=(1, 1,0), which could evolve into (S,R,Q)=(1,0,0) if path 834 back to input R has a shorter delay than the loop back to input S involving the external delay to be measured. The state (S,R,Q)=(1,0,0) is a stable state of the flip-flop 832 that does not lead to periodic signals.

In the embodiment illustrated in FIG. 8, edge triggered element 812 is a one shot edge triggered element. In response to a trigger edge applied at an input to edge triggered element 812, the output of edge triggered element 812 will be a pulse with a similar trigger edge synchronized with the trigger edge of the input. That pulse will have a duration established by the operation of one shot edge triggered element 812. In the embodiment illustrated in FIG. 8, a pulse of a fixed duration is created by delay element 834 in a feedback path between the output and r input of true RS edge triggered flip-flop 832. In the embodiment illustrated, true RS edge triggered flip-flop 832 is triggered on rising edges. Accordingly, a rising edge applied at the S input will result in the output Q being asserted. This asserted value will propagate through delay element 834, presenting a rising edge at the R input. The rising edge at the R input will deassert the output Q. Because flip-flop 832 is a true RS edge triggered flip-flop, the output Q will be deasserted upon receipt of the trigger edge at the R input, regardless of the state of the S input. This R input will be received an amount of time after the trigger edge at the S input that is determined by the amount of delay in delay element 834. Accordingly, the amount of delay introduced by delay element 834 controls the width of the pulse at the Q output in response to a rising edge at the S input of true RS edge triggered flip-flop 832.

Any suitable amount of delay may be introduced in any suitable way by delay element 834. In some embodiments, delay element 834 may be constructed of a small number of logic gates, similar to delay chain 212 (FIG. 2) or other circuitry to introduce a delay, in this case with no net inversion.

In the embodiment illustrated, RS edge triggered flip-flop 832 is triggered on a rising edge applied to its S input. However, edge triggered element 812 may be controlled to respond to any suitable trigger edge. The trigger edge may be either a rising edge or a falling edge. Moreover, because edge triggered element 812 is configurable, it can be configured at some times to respond to rising edges and at other times to respond to falling edge. This capability allows the same circuitry to be used for measuring, and therefore calibrating for, edge-sensitive delays associated with either rising edges or falling edges or both.

Control of the polarity of the trigger edge for edge triggered element 812 may be achieved through a control signal rlf_edge_pol. In the embodiment illustrated, when the signal rlf_edge_pol is deasserted, a rising edge at the input of edge triggered element 812 is coupled through XOR gate 842 to the S input of true RS edge triggered flip-flop 832 as a rising edge. In this state, edge triggered element 812 responds to a rising edge. Conversely, when control signal rlf_edge_pol is asserted, XOR gate 842 operates to invert the input to edge triggered element 812. Accordingly, a falling edge at the input of edge triggered element 812 is coupled to the S input of true RS edge triggered flip-flop 832 as a rising edge, but a rising edge at the input of edge triggered element 812 is coupled through as a falling edge. In this way, true RS edge triggered flip-flop 832 responds to a falling edge at the input of edge triggered element 812.

A similar polarity inversion occurs at the output of true RS edge triggered flip-flop 832. When control signal rlf_edge_pol is deasserted, XOR gate 844 couples through the output of true RS edge triggered flip-flop 832. Accordingly, a rising edge at the Q output of RS edge triggered element 832 appears as a rising edge at the output of edge triggered element 812. Conversely, when the control signal rlf_edge_pol is asserted, XOR gate 844 inverts the value at the output Q of true RS edge triggered flip-flop 832. In this way, a falling edge is produced in synchronization with the falling edge acting as a trigger edge for edge triggered element 812. This falling edge is then coupled back through loop 810.

Regardless of the manner in which the components within loop 810 are configured, signals will propagate around loop 810, changing the state at node 850 for each pass of a signal around loop 850. As described above in connection with FIGS. 2 and 3, the time between these passes depends on the total delay in loop 810. Accordingly, the period between signals detected at node 850 is an indication of the amount of delay introduced into loop 810 by one of the circuit paths $P_0 \ldots P_N$ switched into loop 810. The time difference may be measured in any suitable way. In some embodiments, a period counter, such as period counter 220 (FIG. 3) may be used.

Though, it should be appreciated that there is a relationship between period and frequency such that any element that can measure frequency may also be used to measure the period between successive passes of a signal propagating around loop 810. Accordingly, FIG. 8 shows that node 850 is coupled to a frequency counter. Though, it should be appreciated that any component that directly or indirectly measures the propagation time of a signal around loop 810 may be coupled to node 850, or any other suitable node in the circuitry illustrated in FIG. 8.

In this way, the circuitry illustrated in FIG. 8 may be used as part of a calibration system in an electronic device. The control signals illustrated in FIG. 8 may be generated by a calibration processor, such as calibration processor 330 (FIG. 3) or any other suitable component. The calibration processor may generate signals to measure edge-sensitive delays in a reference path $P_0$ and in each of the other paths $P_1 \ldots P_N$. The calibration processor may, based on differences in measured propagation delays, select calibration values for each of the circuit paths $P_1 \ldots P_N$. The selected values may adjust for edge-sensitive delays for either a rising edge, a falling edge, or both. These calibration values may then be applied to the circuit paths as described above in connection with FIG. 3. Though, as noted above, the circuitry of FIG. 8 also may be controlled to measure delays through the circuit paths $P_0 \ldots P_N$ using conventional delay measurement techniques. Accordingly, the calibration processor may be configured to alternatively or additionally measure average delays, not tied to a specific edge, through the circuit paths and adjust for those delays as described above in connection with FIG. 2. In this way, substantial flexibility may be provided in calibrating for delays in the circuit paths. This flexibility enables delay measurement and calibration techniques as described herein to be applied in many types of systems. For example, calibration techniques as described herein may be used in a manufacturing process for semiconductor devices. Timing accuracy can be valuable in systems testing devices during their manufacture because timing inaccuracy increases the number of semiconductor devices, that are actually operating within specification, but are classified as operating improperly. For example, if an expected response is detected at approximately the expected time, the test system may nonetheless flag the semiconductor device as faulty or as questionable, if the test system cannot accurately determine whether the actual time at which the response occurred is within a window of time allowed per the device specification. When the measured time of an expected response is closer to the end of the allowed window than the timing accuracy of the test system, the device may be flagged as faulty.

Better timing accuracy, which may be achieved by better calibration, can reduce the number of devices falling into this category. Better calibration may be provided by a method of edge-sensitive calibration as described herein that techniques may be used to calibrate automatic test equipment that is used as part of the manufacturing of semiconductor devices. Actions in the manufacturing process may then be conditionally performed based on test results.

The conditional actions may relate to individual devices or may relate to the manufacturing process as a whole. For example, test results are sometimes used in a manufacturing process to "bin" individual devices. In some scenarios, two bins may be provided, corresponding to good or bad devices. Devices that pass all tests may be assigned to the good bin and may be further processed, such as by sealing them in device packages and preparing them for shipment to customers. Conversely, devices that fail one or more tests may be marked for later identification at a point where they can later be removed from the manufacturing flow and discarded.

In some scenarios, more than two bins may be provided, corresponding to multiple levels of performance. A device, for example, may pass all tests when operated at low frequencies, but may fail tests when operated at a higher frequency. Such a device may be assigned to a low speed bin. That device may be packaged and labeled differently than a fully functional device so that the device can be sold as a low speed device. A similar binning operation may be performed for devices containing memory arrays. A flaw in the memory array on a device revealed during testing may limit the usable size of the memory array. Such a device may nonetheless be binned for subsequent labeling and sale as a device with a smaller memory array.

Other types of operations may also be conditionally performed based on test results. For example, some devices are manufactured with redundant circuits. Testing may reveal a defect that can be repaired by substituting a redundant circuit for a faulty circuit. Test results may be used to conditionally route defective but repairable devices to a repair station where alterations on the device may result in a fully functional device, or at least a device that can be sold with a degraded performance specification.

Other operations conditionally taken based on test results may affect the manufacturing process as a whole. For example, test results revealing a growing failure in a manufacturing line rate may signify a piece of equipment that is contaminated or requires adjustment. Accordingly, the conditional actions taken based on test results may include cleaning or adjusting manufacturing equipment.

Having thus described several aspects of at least one embodiment of this invention, it is to be appreciated that various alterations, modifications, and improvements will readily occur to those skilled in the art.

For example, one shot edge triggered element 312 within loop 310 may be realized in ways not involving an SR flip-flop, such as the traditional manner of a two-input AND gate with one input being the signal and the other input being a delayed and inverted copy of the input signal. This is a simple combinatorial circuit having no internal memory. As is well known, for sufficiently long input pulses, this circuit may generate an output pulse of width approximately equal to the intentional delay of the inverted input. However, the behavior is modified if the input pulse is shorter than the intentional delay in the circuit. For such shorter inputs, the output pulse may attain a width approximately equal to the width of the input pulse rather than the width of the intentional delay. Thus, for short pulses, the combinatorial one shot circuit might behave like a pure delay. If circuit path P1 in FIG. 3 has a longer delay for a rising edge signal than for a falling edge signal, it may reduce the width of an incoming pulse. Therefore a pulse of a certain width at the output of the mentioned simple one shot circuit may return to its input with a reduced pulse width. After multiple round trips the consistent pulse width reduction may lead to a complete disappearance of the signal. Though, this deficiency may be removed by the addition of a pulse-stretching circuit. Such circuits are also well-known and as long as the pulse stretching amount is larger than any anticipated pulse shrinking in the signal loop return path, the circuit may sustain a desired persistent oscillation signal. This may limit the generality of the circuit's applicability, since adaptation to the design is required based on the anticipated delays to be measured, but it may be used in cases where sufficient knowledge is available about the pulse width modifying behavior of the delays to be measured.

As another example, circuitry that responded to a rising edge was used as an example of edge triggered circuitry. It should be appreciated that edge triggered circuitry may be designed such that a trigger edge may be either a rising or falling edge.

As a further example, it should be appreciated that, though the invention is illustrated in connection with automatic test equipment used in the manufacture of semiconductor devices, the invention is not so limited. Embodiments of the invention may be used in connection with test equipment of any suitable type or in other types of systems.

As yet another example, the period counter, the calibration processor and any requisite additional circuitry, such as shown in FIGS. 1B and 2, or portions thereof, may be implemented in a single highly integrated electronic circuit that is part of the automated test equipment or other apparatus that requires calibration of signal delay paths.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein. Accordingly, the foregoing description and drawings are by way of example only.

The above-described embodiments of the present invention can be implemented in any of numerous ways. For example, the embodiments may be implemented using hardware, software or a combination thereof. When controlled in software, the software code can be executed on any suitable processor or collection of processors, whether provided in a single computer or distributed among multiple computers. Such processors may be implemented as integrated circuits, with one or more processors in an integrated circuit component. Though, a processor may be controlled using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be controlled by software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus for determining delay along at least one circuit path, the apparatus comprising:
   circuitry configured to form a loop containing the at least one circuit path, the circuitry comprising:
   an edge-triggered element; and
   a period measuring element coupled to the loop so as to measure a period of a signal in the loop;
   wherein:
   the edge-triggered element responds to either a rising trigger edge or falling trigger edge, but not both, of a signal in the loop, and
   following response to a trigger edge, the edge-triggered element resets at a time that is independent of a further trigger edge of the signal in the loop.

2. The apparatus of claim 1, wherein:
   the edge-triggered element comprises an S-R latch.

3. The apparatus of claim 2, wherein:
   the S-R latch has a set input and a reset input and an output; and
   the apparatus further comprises:
   a delay element coupled between the output of the S-R latch and the reset input.

4. The apparatus of claim 2, wherein:
   the S-R latch responds to a first pulse at the reset input and a second pulse at the set input by producing an output pulse, wherein the output pulse sets and resets based on the last trigger edge between the first pulse and the second pulse.

5. The apparatus of claim 4, wherein:
   one of the first pulse and the second pulse is surrounded by another one of the first pulse and the second pulse.

6. The apparatus of claim 4, wherein:
   one of the first pulse and the second pulse overlaps with another one of the first pulse and the second pulse.

7. The apparatus of claim 1, wherein:
the at least one circuit path comprises a plurality of circuit paths; and
the loop further comprises:
   a multiplexer; and
   a demultiplexer,
wherein the multiplexer and demulitplexer are configured to selectively connect in the loop a circuit path of the plurality of circuit paths.

8. The apparatus of claim 7, wherein:
the period measuring element comprises a frequency counter; and
the apparatus further comprises a control component for comparing a frequency determined by the frequency counter with a first of the plurality of paths connected in the loop with a frequency determined by the frequency counter with a second of the plurality of paths connected in the loop.

9. An apparatus for determining delay along at least one circuit path, the apparatus comprising:
circuitry configured to form a loop containing the at least one circuit path, the circuitry comprising:
an edge-triggered element;
a period measuring element coupled to the loop; and
a gate connected to an input of the edge triggered element, the gate comprising an output, a first input and a second input, the first input and the output of the gate being connected in the loop, and the gate being adapted to:
   provide at the output of the gate a signal in a same state as a signal at the first input when a signal at the second input is in the first state; and
   provide at the output of the gate a signal in the second state when a signal at the second input is in the second state,
wherein the edge-triggered element responds to either a rising trigger edge or falling trigger edge, but not both, of a signal in the loop.

10. The apparatus of claim 9, wherein:
the gate is a first gate;
the apparatus comprises a second gate connected to an output of the edge triggered element, the second gate comprising an output, a first input and a second input, the first input and the output of the second gate being connected in the loop, and the second gate being adapted to:
   provide at the output of the second gate a signal in a same state as a signal at the first input of the second gate when a signal at the second input of the second gate is in the first state; and
   provide at the output of the second gate a signal in the second state when a signal at the second input of the second gate is in the second state,
wherein the second input of the second gate is coupled to the second input of the first gate.

11. The apparatus of claim 1, further comprising:
a switching element configured to selectively connect and disconnect the edge-triggered element from the loop.

12. The apparatus of claim 1, wherein:
the edge triggered element comprises a one shot circuit.

13. The apparatus of claim 12, wherein:
the edge triggered element further comprises a pulse stretching circuit.

14. An apparatus for determining delay along at least one circuit path, the apparatus comprising:
circuitry configured to form a loop containing the at least one circuit path, the circuitry comprising:
an edge-triggered element; and
a period measuring element coupled to the loop;
wherein:
   the edge-triggered element responds to either a rising trigger edge or falling trigger edge, but not both, of a signal in the loop; and
   the edge triggered element comprises:
      a set input and a reset input and an output;
      a first latch comprising a first input coupled to the set input, a second input coupled to the reset input and a first latch output;
      a second latch comprising a first input coupled to the set input, second input coupled to the reset input through an inverting element and a second latch output; and
      a third latch having a first input coupled to the set input, a second input coupled to the reset input, a third input coupled to the first latch output, and a fourth input coupled to the second latch output.

15. The apparatus of claim 1, wherein:
the edge triggered element comprises a component having a set input and a reset input and an output;
the output is coupled to the reset input through a delay; and
the component is configured to hold a value at the output upon transition from a state in which both the set input and reset input are asserted to a subsequent state in which only one of the set input and reset inputs is asserted.

16. The apparatus of claim 15, wherein:
the component is further configured to invert the value at the output upon transition from a state in which only one of the set input and reset input is asserted to a subsequent state in which both of the set input and reset inputs is asserted.

17. The apparatus of claim 16, wherein:
the component is further configured to assert the value at the output upon transition from a state in which one or none of the set input and reset input is asserted to a subsequent state in which the set input is asserted.

18. The apparatus of claim 17, wherein:
the component is further configured to de-assert the value at the output upon transition from a state in which one or none of the set input and reset input is asserted to a subsequent state in which the reset input is asserted.

* * * * *